United States Patent [19]

Mateika et al.

[11] Patent Number: 4,609,425
[45] Date of Patent: Sep. 2, 1986

[54] COLD CRUCIBLE SYSTEM AND METHOD FOR THE MEETING AND CRYSTALLIZATION OF NON-METALLIC INORGANIC COMPOUNDS

[75] Inventors: Dieter W. Mateika, Ellerbek; Rolf Laurien, Pinneberg, both of Fed. Rep. of Germany

[73] Assignee: U.S. Philips Corporation, New York, N.Y.

[21] Appl. No.: 606,020

[22] Filed: May 2, 1984

[30] Foreign Application Priority Data

May 6, 1983 [DE] Fed. Rep. of Germany ....... 3316547

[51] Int. Cl.$^4$ .................. C30B 15/10; C30B 15/24
[52] U.S. Cl. .................. 156/617 SP; 156/617 V; 156/619; 156/DIG. 83; 422/106; 422/249
[58] Field of Search .......... 422/106, 248, 249; 156/601, 608, 617 SP, 617 V, 619, DIG. 83; 432/262, 264; 373/144, 156, 163

[56] References Cited

U.S. PATENT DOCUMENTS

| | | | |
|---|---|---|---|
| 2,686,212 | 8/1954 | Horn et al. | 156/617 SP |
| 3,025,191 | 3/1962 | Leverton | 156/608 |
| 3,067,139 | 12/1962 | Goorissen | 156/617 SP |
| 3,582,528 | 6/1971 | Seale et al. | 156/617 SP |
| 3,637,439 | 1/1972 | DeBle | 156/617 SP |
| 4,036,595 | 7/1977 | Lorenzini et al. | 156/617 SP |
| 4,049,384 | 9/1977 | Wenckus et al. | 156/617 SP |
| 4,203,951 | 5/1980 | Goriletsky et al. | 422/249 |
| 4,246,064 | 1/1981 | Dewees et al. | 156/617 SP |

FOREIGN PATENT DOCUMENTS 2245250 3/1974 Fed. Rep. of Germany ...... 156/617 SP

Primary Examiner—David L. Lacey
Attorney, Agent, or Firm—Norman N. Spain

[57] ABSTRACT

A cold crucible system and method for melting and crystallizing non-metallic inorganic compounds having a crucible, the side and the bottom of which are formed of metal pipes through which a cooling medium flows and independently excitable induction coils surrounding the side wall and the bottom of the crucible for coupling high energy into non-metallic inorganic compound present in said crucible and thus to melt said compound in said crucible, a member formed of an electrically conductive material and inert to any of said melt present in said crucible positioned at a distance above the bottom of the crucible and a container, opened at the top, lowered so as to project from the melt formed in the crucible, provided with apertures for the flow of the melt, and so positioned so as to contain up to 25% of the contents of the crucible.

18 Claims, 3 Drawing Figures

COLD CRUCIBLE SYSTEM AND METHOD FOR THE MEETING AND CRYSTALLIZATION OF NON-METALLIC INORGANIC COMPOUNDS

BACKGROUND OF THE INVENTION

The invention relates to a cold crucible system for melting and crystallizing non-metallic inorganic compounds having a cooled crucible wall in the form of metal pipes through which cooling medium flows and which are in mechanical connection with the crucible bottom through which cooling medium also flows and having a first induction coil which surrounds the crucible wall and via which high-frequency energy can be coupled into the contents of the crucible, as well as a second induction coil which can be switched independently of the induction coil surrounding the wall of the crucible and which is arranged below the crucible bottom.

The invention further relates to the use of the cold crucible system for growing single crystals from melts on the basis of a rare earth metal/gallium garnet.

A cold crucible system is suitable for carrying out the so-called skull melting method for melting starting materials for the growth of single crystals by direct coupling-in of an electromagnetic field from an induction coil into the material to be heated. Such a crucible may be formed having a wall of water-cooled copper pipes which are arranged closely beside each other in the form of a circle while the bottom of the crucible may consist of a water-cooled metal plate or of several copper pipes, a high-frequency coil being provided around the cylindrical crucible wall. The electromagnetic field penetrates through the slots between the copper pipes into the interior of the crucible. Such a crucible is known, for example, from V. I. Aleksandrov, V. V. Osiko, A. M. Prokhorov and V. M. Tatarintsev "Synthesis and Crystal Growth of Refractory Materials by RF Melting in a Cold Container" in: Current Topics in Materials Science, Vol. 1, ed. by E. Kaldis, North Holland Publ. Comp., 1978.

The operation of such a known cold crucible will be described with reference to an example. For melting, the material is generally filled in the crucible in powder form. Poorly conducting oxides must first be preheated. For this purpose, pieces of metal which correspond to the oxide to be melted are used which are embedded in the powder. The electromagnetic field first heats the pieces of metal through the induced eddy currents which in turn melt the oxide powder in the immediate proximity of the metal pieces. The the high frequency field of the coil can couple-in directly in the melt being formed due to the higher electric conductivity of the melt. By increasing the high-frequency power addition oxide powder is continuously melted until the melt comes in the proximity of the crucible wall. The water-cooled inner crucible surface ensures that between the surface of the crucible wall and the hot melt a densely sintered specific layer which is present in a solid phase is formed which protects the crucible from the attack by the melt. The metal used for preheating is converted into the oxide to be melted by oxygen from the air.

For example, $Al_2O_3$ single crystals have been grown by means of such known crucibles. For this purpose, an $Al_2O_3$ melt has been seeded with a seed crystal of sapphire. By drawing the seed crystal away from the surface of the melt at a rate of from 10 to 30 mm/h, $Al_2O_3$ single crystals could be manufactured in a length up to 160 mm and a diameter up to 35 mm.

It has now been found that perfect crystals can be grown by means of the known crucible only in exceptional cases. Difficulties may present themselves in particular in melts of low viscosity. For example, turbulent flux lines can be observed at the surface of the melts which indicate that turbulent convection currents are induced as a phenomenon resulting from the absorption of the high-frequency field in the melt. A radial temperature distribution on the surface of the melt with a temperature minimum in the centre, as it is required for growing single crystals, cannot adjust in such a melt. When the temperature of the melt is reduced for the purpose of increasing the crystal diameter of the crystal to be grown, the crystal seeds simultaneously also grow on the sintered layer present in a solid phase on the cooled crucible inner wall and the cooled crucible inner bottom. By increasing the thickness of said layer the volume of the melt is reduced and hence its electrical conductivity. The electric power no longer couples in sufficiently so that the temperature of the melt decreases further. This process occurs exponentially acceleratedly so that also when the high-frequency power is increased, the melt reaches a critical volume after a short time and solidifies.

The thermal losses at the cooled inner surfaces of the wall of the crucible and the necessity to operate as far as possible above the critical melt volume (thin sintering layer) necessitate a considerable overheating of the melt. Resulting phenomena of this overheating are the evaporation of volatile material components and turbulent melt convections coupled with temperature fluctuations.

SUMMARY OF THE INVENTION

It is the object of the invention to provide a cold crucible system in which the difficulties described do not occur, with which turbulences in the melt can be excellently controlled, and in which the temperature gradient in the melt can be adjusted so that large single crystals can also be grown in an excellent manner.

According to the invention this object is achieved in that there are present inside the crucible, held at a distance above the bottom of the crucible, a member formed of an electrically conductive material which is inert with respect to a melt present in the crucible, and a container which is lowered in the melt but above said member, is open towards the open side of the crucible, has apertures through which the melt can flow, consists of a material which is inert with respect to the melt, projects from the melt and has such a capacity so spaced from the wall of the crucible and from the bottom of the crucible such that up to 25% of the overall crucible contents are contained in it.

According to a further advantageous embodiment of the invention the bottom of the crucible consists of a dielectric material. This provides the advantage that that with inductive heating of the crucible content no electric losses occur from the bottom of the crucible.

According to a further advantageous embodiment of the invention the bottom of the crucible consists of a quartz plate below which the cooling medium flows and which is incorporated in a holder which is connected to spring journalled supports. By this means the further advantage is achieved that forces occurring in the vertical direction as a result of an expansion of the melt upon heating are compensated for, so that destruction of the quartz plate is avoided. In this manner the life of the crucible is considerably extended.

According to advantageous further embodiments of the invention the member and the container may consist of iridium, platinum or graphite. These materials are inert with respect to melts of non-metallic inorganic compounds and are selected according to efficacity. Since the member must function as a heating member for heating the melt it is required that it consist of an electrically conductive material which can rapidly be heated as a result of induced eddy currents. The container on the contrary may serve as an additional heating means in which case electrically conductive material which is inert with respect to the melt may also be chosen for it, but it may also only serve the function of producing inside the melt a molten region which is free from turbulences, in which case it may consist of a material which is inert with respect to the melt which cannot easily be heated inductively.

With the crucible system according to the invention the advantages are generally achieved that as a result of use of the individually switchable induction coils energized by different energy supplies a locally directed heating of the crucible content can be carried out and that as a result the temperature gradient in the melt can be influenced. By means of the container a radial temperature distribution in the melt can be achieved with a temperature minimum in the center of the melt surface.

A further advantage of the crucible system according to the invention is that convection current in the melt in the inner space of the crucible can be influenced directly by means of the apertures in the container. As a result of this and as a result of the small height of the melt present within the container unstable growth periods are avoided which has proved to be particularly advantageous in melts which have a low viscosity, for example, melts from which rare earth metal/gallium garnet single crystals are to be grown. It had been known so far to grow rare earth metal/gallium garnet single crystals according to the Czochralski crucible melting process. However, in this process difficulties often occur which can be avoided by means of the crucible according to the invention. These difficulties which occur in the crucible melting process, and also when using the known cold crucible, may consist in that in particular in the case of large melt volumes, turbulent melt convections coupled with temperature oscillations and fluctuations can often occur which may lead to unstable growth periods and to pronounced growth stripes in the grown crystals.

A further advantage of the crucible according to the invention is that in comparison with crucibles for the crucible melting process according to Czochralski the quantity of the noble metal, for example iridium, required for the manufacture of the crucible device is considerably smaller. For example, when an iridium crucible of 3.5 kg weight is necessary for 6 kg of melt, the quantity of iridium for a cold crucible of the same content according to the invention (for the member and the container) is only 0.6 kg. A further advantage is that the possibility of pollution of the melt by the crucible material is considerably smaller in the cold crucible according to the invention as compared with crucibles employed in the known crucible melting process, because a large part of the crucible wall is formed by a natural sintered layer which is present in a solid phase. In crucibles employed in the known crucible melting process, defects in the crucible, for example, cracks, holes etc., result in loss of melt. The sintered layer which is present in a solid phase on the cooled inner wall of the cooled crucible according to the invention on the contrary provides a safe protection against the loss of melt.

DETAILED DESCRIPTION OF THE INVENTION

Figure 1:
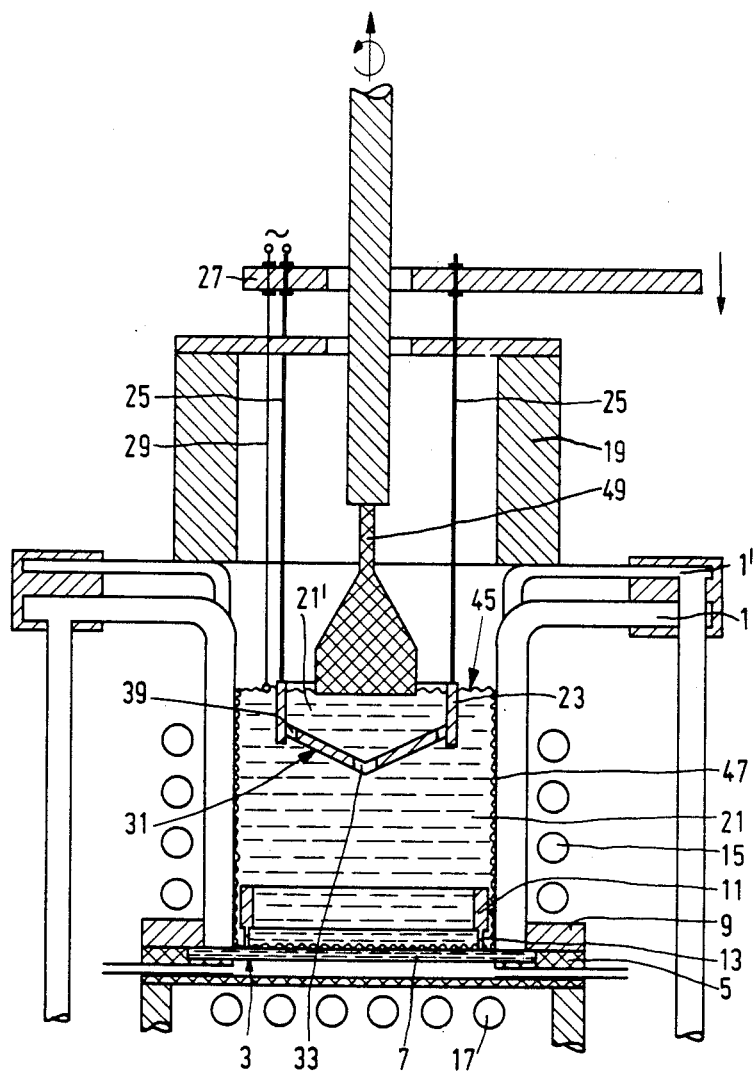
FIG. 1 is a sectional view of a crucible system according to the invention.

The invention will now be described in greater detail with reference to the drawing. In the drawing:

FIG. 1 is a sectional view of a cold crucible system according to the invention. The crucible consists of double-walled metal pipes preferably of copper through which a cooling medium, preferably water, flows and which are bent at right angles and are arranged in a circle. The outer pipes 1 mutually have a spacing of 0.3 mm and are sealed at the lower end. The surface of the pipes 1, 1' should preferably be protected against oxidation influences which in the case of copper pipes may be provided by means of an approximately 6 μm thick layer of rhodium. The bottom 3 of the crucible through which cooling medium flows is formed by a base member 5 which may consist, for example, of a heat-resistant synthetic resin, a plate 7 of a dielectric material which is inert with respect to the melt, for example quartz, and a ring 9 also of dielectric material, for example $Al_2O_3$, which gives the crucible wall which consists of the pipes 1 additional stability and fixes it in its position. The base member 5 has recesses for receiving the plate 7 and is connected to the ring 9 preferably through screws not shown. A member 11 formed of an electrically conductive material which is inert with respect to the melt (in this case a ring of iridium) bears on the plate 7 by means of supports 13. The crucible wall formed by the pipes 1 surrounds a pipe of a heat-resistant material, for example quartz (not shown), and is surrounded by an annular induction coil 15 through which the high-frequency energy can be coupled into the crucible contents. The induction coil 15 is connected to a high-frequency generator not shown whose operating frequency is between 1 and 7 MHz. Below the bottom 3 of the crucible a second induction coil 17 is provided via which preferably energy of a lower frequency than that which is supplied to the crucible contents via the first induction coil 15, can be coupled into the crucible contents. The second induction coil 17 is connected to a generator not shown which, for example, has an operating frequency in the range from 7 to 10 kHz. Both generators can be switched independently of each other. A structure 19 formed of a heat-resistant material, for example an oxidic ceramic, is provided on the upper surface of the crucible edge and serves to reduce thermal losses.

A container 23 of a material which is inert with respect to the melt, for example iridium, is lowered in a melt 21 present in the crucible. The container 23 has a flat inclined bottom 31 which is conical towards the bottom of the crucible and is connected, via rods 25, to a driving device 27 which can be moved vertically and which driving device serves to lower and raise the container 23 and thus forming a vertical positioning means. A detector 29 is connected, in common with one of the rods 25, to an electric circuit and serves as a measuring instrument for determination of the filling height of the melt 21. The detector 29 also consists of a material which is inert with respect to the melt, for example iridium.

Figure 2:
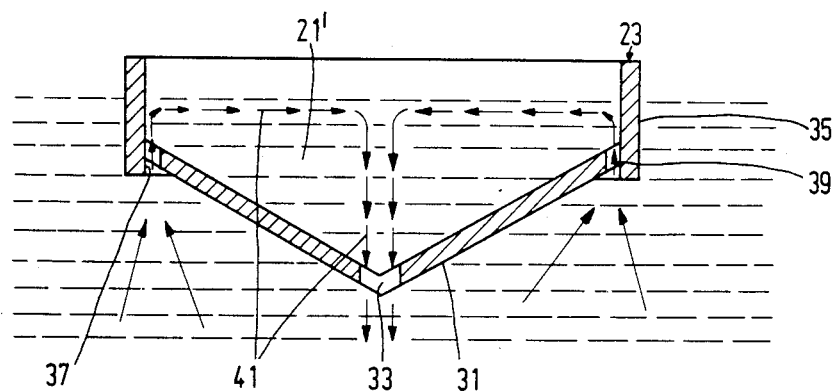
FIG. 2 is a sectional view on an enlarged scale of the container for the crucible which also shows the direction of flow of the convection currents in the melt present in the container.

FIG. 2 is a sectional view on an enlarged scale of the container 23. The conical container bottom 31 has a central aperture 33, in this example a circular aperture having a diameter of 8 mm. The container has an inside diameter of 76 mm, a height of the cylindrical wall of 20 mm and a wall thickness of 2 mm. The conical bottom 31 is connected to a ring 35 connected to the inner wall of the holder in such manner that a 2 to 3 mm wide projecting edge 37 is formed. The material for all the parts of the container 23 is inert with respect to the melt and in this example is iridium. Between the ring 35 and the bottom 31 diametrically oppositely located slots 39 are provided in a length of 20 to 30 mm and a width <1 mm. The direction of the convection currents in the melt 21' is shown diagrammatically by the arrows 41. The container 23 is positioned inside the crucible shown in FIG. 1 so as to slightly surmount the melt, preferably by 2 to 5 mm.

Figure 3:
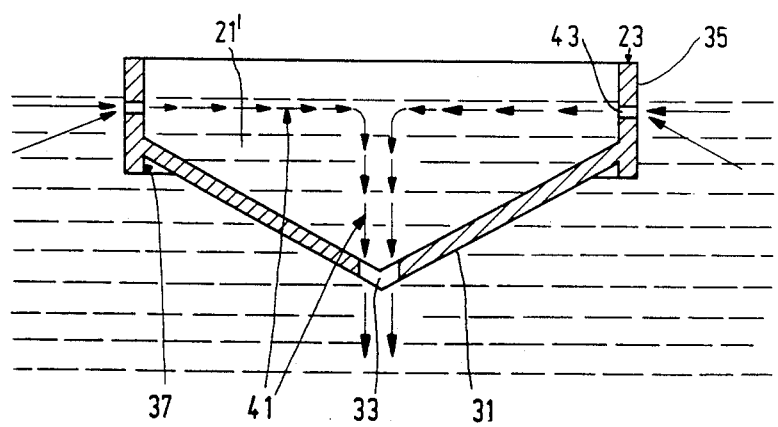
FIG. 3 is a sectional view on an enlarged scale of a modified embodiment of the container for the crucible according to the invention in which the direction of flow of the convection current in inside the melt present in the container are also shown.

FIG. 3 shows a slightly modified embodiment of the container 23 shown in FIG. 2: slots which enable the convection in the melt 21' present in the container in this case are provided on the circumference of the cylindrical side wall of the container 23 in the form of slots 43. The dimensions of the slots 43 correspond to those of the slots 39. The remaining reference numerals correspond to those of FIG. 2. The arrows 41 in this case also describe the direction of the convection currents inside the melt 21'. It is advantageous to position crucibles of this type inside the melt in the crucible so that the slots 43 are situated closely below the surface 45 of the melt (FIG. 1).

The operation of the cold crucible according to the invention will now be described with reference to an example for the manufacture of single crystals on the basis of rare earth metal/gallium garnet.

For the melting process, the crucible according to FIG. 1 is filled with a powdered starting material in the form of, for example, $Nd_3Ga_5O_{12}$. The generators to actuate the induction coils 15 and 17 are both switched on simultaneously. Preferably, energy is first coupled into the member 11 via the induction coil 17 and heats this induction coil to a temperature above the melting point of the garnet material (1550° C.). After a sufficient volume of melt has formed in the lower part of the crucible, energy is also coupled directly into the melt 21 via the induction coil 15 surrounding the crucible wall. The heating period is continued until the total contents of the crucible is present as a melt.

The member 11 at the bottom of the crucible first has for its object to start the process of melting the powdered material to be melted and to form a certain volume of melt so that further high-frequency energy can be coupled directly into the melt 21 via the induction coil 15. In this phase of the melting process the member 11 also serves to a certain extent as a preheater. After melting the total quantity of material present in the crucible the member 11 assumes the function of an independently controllable additional heating element.

A sintered layer 47 is thus formed at the cooled inner wall of the crucible and at the cooled inner bottom of the crucible.

The growth of the sintered layer 47 in the direction of its thickness can be controlled within certain limits by varying the heating power of the two induction coils 15 and 17. The additional heating in the form of the member 11 hence essentially contributes to the stabilization of the melting process.

In none of the experiments performed by means of the crucible according to the invention was the critical melt volume reached.

Figure 1A:
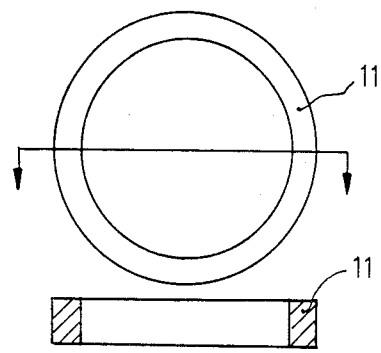
FIGS. 1a, 1b, 1c and 1d are top and perspective views of a number of an electrically conductive material present in said crucible as a ring, as a disc with holes, as a disc with slots and a disc with a side wall respectively.
Figure 1B:
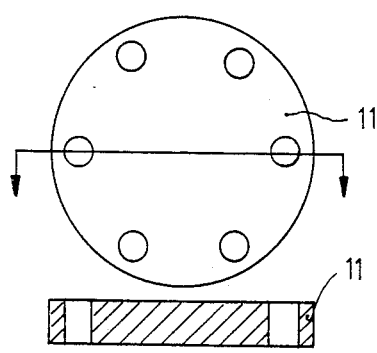
Figure 1C:
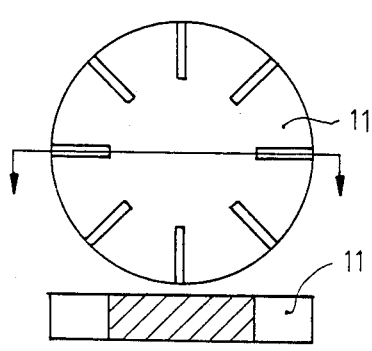
Figure 1D:
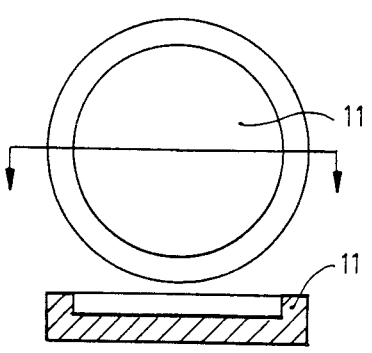

The form of the member 11 serving as additional heating may be adapted to practical requirements. In the above-mentioned example a member 11 in the form of a ring as in FIG. 1a was used. However, the member 11 may also be in the form, for example, of a disc which has a slightly smaller diameter than the inside diameter of the bottom of the crucible, which disc may be solid or be provided with apertures, for example holes as in FIG. 1b or slots as in FIG. 1c; advantageously, however, it may also be a disc with or without apertures which has a side wall upright on the disc as shown in FIG. 1d.

During the heating period the container 23 is held above the contents of the crucible. After a free surface 45 of melt has formed, the container 23 is lowered into the melt 21 by means of the mechanical driving device 27. It is positioned so that upper edge of the container 27 projects 2 to 5 mm from the melt 21. The container 23 is filled with melt 21' through the aperture 33 in the bottom 31 of the container 23 and the slots 39 and 43, respectively. The container 23 serves to adjust a radial temperature distribution with a temperature minimum in the center of the surface 45 of the melt. The melt 21 penetrates through the slots 39, 43 into the container 23, flows as a melt 21' while being cooled, to the center of the container 23, and leaves same through the aperture 33 in the bottom 31 of the container.

The flow image described here was observed in a simulation experiment while using aluminum particles and water. The arrows 41 in FIGS. 2 and 3 diagrammatically show the direction of flow of the particles.

In garnet melts the flux lines inside the container 23 are formed weakly and merge in the center in the form of spokes. Such a flux line picture occurs empirically with radial temperature distribution in the melt.

For growing a single crystal a seed crystal 49 is contacted with the surface 45 of the melt after a stabilization period of approximately 15 minutes. The crystal is then pulled up out of the melt while being rotated. By slowly reducing the power of the generator connected to the induction coil 15 the diameter of the growing crystal is increased up to the desired final diameter. The power of the said generator is then controlled so that the crystal continues growing at a constant diameter. During the crystal growth the container 23 is driven by means of the driving device 27 in accordance with the lowering level of the melt so that the height of the melt in the container 23 remains constant. The change of the level of the melt is transmitted by the detector 29 the signal of which controls the driving device 27.

After termination of the crystal growth, first the grown crystal is separated from the remainder of the melt by rapid raising. The container 23 is then drawn out of the melt 21 and the crystal is cooled to room temperature by reducing the power of the generators connected to the induction coils 15 and 17.

For the growth of $Nd_3Ga_5O_{12}$ single crystals according to the above-described method, 6 kg of $Nd_3Ga_5O_{12}$ was provided in the crucible as a starting material. As a seed crystal an $Nd_3Ga_5O_{12}$ single crystal was used. During the growth the growing crystal was rotated at a rate of 14 $min^{-1}$ and drawn out of the melt at a rate of 4 mm/h. $Nd_3Ga_5O_{12}$ single crystals having a length of up to 60 mm and a diameter of up to 40 mm were grown. Measurements at the crystals thus grown demonstrated that crystals grown from the cold crucible according to the invention showed growth stripes of weaker voltage double refraction than crystals which had been manufactured according to the Czochralski crucible melting method.

The above-described method may be varied in such manner that the level of the melt is kept constant by the supply of non-melted material into the crucible in the space between the container 23 and the wall of the crucible formed by the pipes 1 from a refilling device controlled by means of the detector 29. In this type of operation the position of the container 23 remains unvaried.

As a further example, NaCl single crystals were manufactured. The crucible shown in FIG. 1 was filled with 2 kg of NaCl and the method described above for the growth of $Nd_3Ga_5O_{12}$ single crystals was used. An NaCl single crystal served as a seed crystal. During the growth the growing crystal was rotated at a rate of 20 $min^{-1}$ and drawn out of the melt at a rate of 18 mm/h. NaCl single crystals were grown having a length of up to 190 mm and a diameter of up to 55 mm.

What is claimed is:

1. A cold crucible system for melting and crystallizing a non-metallic inorganic compound comprising a crucible having a wall section and a bottom (3), said wall section being formed of hollow metal pipes having a cooling medium flow therethrough said pipes being mechanically connected to said bottom for providing flow of said cooling medium through said bottom; a first inductance coil surrounding the wall section of said crucible, a second induction coil, independently switchable of said first induction coil and positioned below the bottom of said crucible, both of said induction coils providing a coupling of high frequency energy into any non-metallic inorganic compound present in said crucible and providing a melt of said compound in said crucible, wherein said crucible contains a member (11) of an electrically conductive material, rapidly heatable by induced eddy currents and inert to any melt (21) present in said crucible, positioned at a distance above the bottom (3) of said crucible and a container (23) consisting of a material inert to melt (21) present in said crucible, open in the direction opposite to that of the bottom of said crucible, provided with apertures (33, 39, 43) for passage of said melt and being of such a capacity and so positionable in relation to the wall section and the bottom of said crucible so as to contain up to 25% of the overall contents of said non-metallic inorganic compound present in said crucible while having an upper edge projecting from said crucible and means connected to said container for vertically moving said container in and out of said crucible.

2. A cold crucible system as claimed in claim 1, wherein the member (11) is in the form of a ring.

3. A cold crucible system as claimed in claim 1, wherein the member (11) is in the form of a solid disc.

4. A cold crucible system as claimed in claim 1, wherein the member (11) is in the form of an apertured disc.

5. A cold crucible system as claimed in claim 1, wherein the member (11) is in the form of a disc having an upright sidewall.

6. A cold crucible system as claimed in claim 1, wherein the bottom (3) of the crucible consists of a dielectric material.

7. A cold crucible system as claimed in claim 6, wherein the bottom (3) of the crucible consists of a quartz plate (7) below which a cooling medium flows and which is incorporated in a holder (5) which is connected to spring journalled supports.

8. A cold crucible system as claimed in claim 1, wherein water is the cooling medium.

9. A cold crucible as claimed in claim 1, wherein the member (11) and the container (23) consist of iridium.

10. A cold crucible system as claimed in claim 1, wherein the member (11) and the container (23) consist of platinum.

11. A cold crucible system as claimed in claim 1, wherein the member (11) and the container (23) consist of graphite.

12. A cold crucible system as claimed in claim 1, wherein the metal pipes (1) forming the wall section of the crucible consist of copper.

13. A cold crucible system as claimed in claim 12, wherein the metal pipes have a coating which prevents oxidation.

14. A cold crucible system as claimed in claim 1, wherein a vertically moving driving device (27) is connected to the container (23) so that the container (23) can be moved vertically.

15. A cold crucible as claimed in claim 1 further including a detector (29) positioned and arranged for measuring the level of the melt (21).

16. A cold crucible system as claimed in claim 1, wherein the container (23) has a geometry such that the wall section of the container extends parallel to the wall of the crucible and that the bottom (31) of the container extends conically in the direction towards the bottom (3) of the crucible.

17. A cold crucible system as claimed in claim 1, wherein said container (23) is provided with a wall and a bottom (31) in which bottom apertures are provided.

18. A method of growing single crystals of rare earth metal gallium garnets from melts thereof said method comprising,
(a) placing a rare earth gallium garnet powder into a crucible having a wall formed of hollow metal pipes through which a cooling medium flows, and a bottom mechanically connected to said pipes to allow flow of said cooling medium through said bottom, inductive coil means for independently coupling high frequency through said wall and said bottom into said powder, a member (11) of an electrically conductive material, rapidly heatable by induced eddy currents and inert to melt of said powder positioned at a distance above the bottom of said crucible and a container (23) consisting of a material inert to said melt, open at the top and provided with apertures (33, 39, 43) for passage of said melt, and being vertically positionable within said melt so as to contain up to 25% of said melt while projecting from said melt;

(b) inductively heating said powder through said inductive coil means to thereby form a melt of said garnet in said crucible;

(c) lowering said container (23) into said melt to a depth such that the upper edge of said container projects from the melt and it is filled, by flow through said apertures, of up to 25% of the melt present in said crucible;

(d) contacting a crystal of said garnet with said melt present in said container (23) while slowly decreasing the content of high frequency energy coupled to said melt in said container (23) thereby slowly cooling said melt in said container (23) and causing crystal growth of said melt to occur in said container.

* * * * *